(12) United States Patent
You et al.

(10) Patent No.: US 9,928,801 B2
(45) Date of Patent: Mar. 27, 2018

(54) ARRAY SUBSTRATE AND FABRICATION METHOD THEREOF, DISPLAY DEVICE AND DRIVING METHOD THEREOF

(71) Applicant: BOE TECHNOLOGY GROUP CO., LTD., Beijing (CN)

(72) Inventors: Jaegeon You, Beijing (CN); Xin Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 14/241,972

(22) PCT Filed: Jun. 28, 2013

(86) PCT No.: PCT/CN2013/078430
§ 371 (c)(1),
(2) Date: Feb. 28, 2014

(87) PCT Pub. No.: WO2014/146379
PCT Pub. Date: Sep. 25, 2014

(65) Prior Publication Data
US 2015/0294638 A1 Oct. 15, 2015

(30) Foreign Application Priority Data
Mar. 18, 2013 (CN) .......................... 2013 1 0085091

(51) Int. Cl.
*G09G 3/38* (2006.01)
*G02F 1/155* (2006.01)
(Continued)

(52) U.S. Cl.
CPC ............... *G09G 3/38* (2013.01); *G02F 1/155* (2013.01); *G09G 3/19* (2013.01); *H01L 27/124* (2013.01);
(Continued)

(58) Field of Classification Search
CPC ........ G09G 3/38; G09G 3/19; G09G 2300/08; G09G 2310/0235; G09G 2300/0809;
(Continued)

(56) References Cited

U.S. PATENT DOCUMENTS 6,628,355 B1 * 9/2003 Takahara ............. H04N 9/3167
348/E9.027
2005/0253800 A1 11/2005 Johnson et al.
(Continued)

FOREIGN PATENT DOCUMENTS

CN 1662847 A 8/2005
CN 101251696 A 8/2008
(Continued)

OTHER PUBLICATIONS

Second Chinese Office Action dated May 6, 2015; Appln. No. 201310085091.9.
(Continued)

*Primary Examiner* — Kenneth Bukowski
(74) *Attorney, Agent, or Firm* — Ladas & Parry LLP

(57) ABSTRACT

An array substrate and a fabrication method thereof, and a display device and a driving method thereof are provided. The array substrate includes a gate line, a data line, and a pixel electrode disposed within a pixel region defined by the gate line and the data line intersecting with each other. The array substrate further includes an additional electrode disposed between at least two adjacent pixel electrodes.

11 Claims, 3 Drawing Sheets

(51) Int. Cl.
 *G09G 3/19* (2006.01)
 *H01L 27/12* (2006.01)
(52) U.S. Cl.
 CPC ..... *H01L 27/1259* (2013.01); *G09G 2300/08* (2013.01); *G09G 2300/0809* (2013.01); *G09G 2310/021* (2013.01); *G09G 2310/0235* (2013.01); *G09G 2310/0262* (2013.01)
(58) Field of Classification Search
 CPC ...... G09G 2310/0262; G09G 2310/021; H01L 27/124; H01L 27/1259
 See application file for complete search history.

(56) References Cited

U.S. PATENT DOCUMENTS

2007/0289768 A1 12/2007 Moore et al.
2008/0105943 A1* 5/2008 Furst .................. H01L 27/307
 257/448
2012/0170100 A1 7/2012 Yang et al.

FOREIGN PATENT DOCUMENTS

CN 101401492 A 4/2009
JP 2008-052046 A 3/2008

OTHER PUBLICATIONS

International Search Report dated Dec. 9, 2013; Appln. No. PCT/CN2013/078430.
First Chinese Office Action Appln. No. 201310085091.9; Dated Jan. 19, 2015.
Chinese Patent Certificate dated Aug. 12, 2015; CN103226275.
International Preliminary Report on Patentability dated Sep. 22, 2015; PCT/CN2013/078430.

* cited by examiner

ARRAY SUBSTRATE AND FABRICATION METHOD THEREOF, DISPLAY DEVICE AND DRIVING METHOD THEREOF

TECHNICAL FIELD

Embodiments of the invention relate to an array substrate and a fabrication method thereof, and a display device and a driving method thereof.

BACKGROUND

Electro Chromism (EC) refers to a phenomenon where optical properties (such as reflectivity, transmissivity, absorptivity, etc.) of a material change stably and reversibly under the effect of an external electric field, and EC exhibits in appearance as a reversible change in color and transparency. The material with electrochromic property is known as an EC material. An EC display device made of the EC material not only does not require a backlight, but also consumes no power upon displaying a static image as long as the displayed image is not changed, and thus the EC display device can save energy. In addition, the EC display device has the advantages of no blind angle, high contrast, low fabrication cost, wide operation temperature range, low driving voltage, rich in colors and the like, and thus is promising in the fields of meter display, outdoor advertisement, static display and the like.

The EC material is provided between the upper and lower electrodes of the display device, the color of the EC material changes when a voltage is applied and remains transparent when no voltage is applied. The EC display device achieves a pattern display by controlling the voltage applied to the EC material, wherein the region where the voltage is applied is a colored region, the region where no voltage is applied is a colorless region, and the colored region and the colorless region form the pattern. However, because the EC material is in a liquid state, its fluidity may render mutual diffusion between the EC material molecules in the colored region and the EC material molecules in the adjacent colorless region, and in this case a crosstalk occurs.

SUMMARY OF THE INVENTION

According to one embodiment of the invention, an array substrate of an electro chromism display device is provided. The array substrate includes a gate line, a data line, and a pixel electrode disposed within a pixel region defined by the gate line and the data line intersecting with each other. The array substrate further includes an additional electrode disposed between at least two adjacent pixel electrodes.

According to another embodiment of the invention, a fabrication method for an array substrate is provided. The array substrate includes a gate line, a data line, and a pixel electrode disposed within a pixel region defined by the gate line and the data line intersecting with each other. The method includes: forming the pixel electrode and an additional electrode on a substrate, and the additional electrode is disposed between at least two adjacent pixel electrodes.

According to yet another embodiment of the invention, a display device is provided. The display device includes the array substrate as described above and an additional electrode driver chip, and the additional electrode driver chip is electrically connected with the additional electrode via a lead.

According to still yet another embodiment of the invention, a driving method for the display device as described above is provided. The driving method includes: applying a scanning signal to the gate line in a line-by-line mode by a gate driver chip, and in the meantime, applying a voltage signal to the data line by a data driver chip. The driving method further includes: applying a drive voltage to the additional electrode by the additional electrode driver chip via a lead, and the drive voltage is equal to a voltage applied on a common electrode in the display device.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
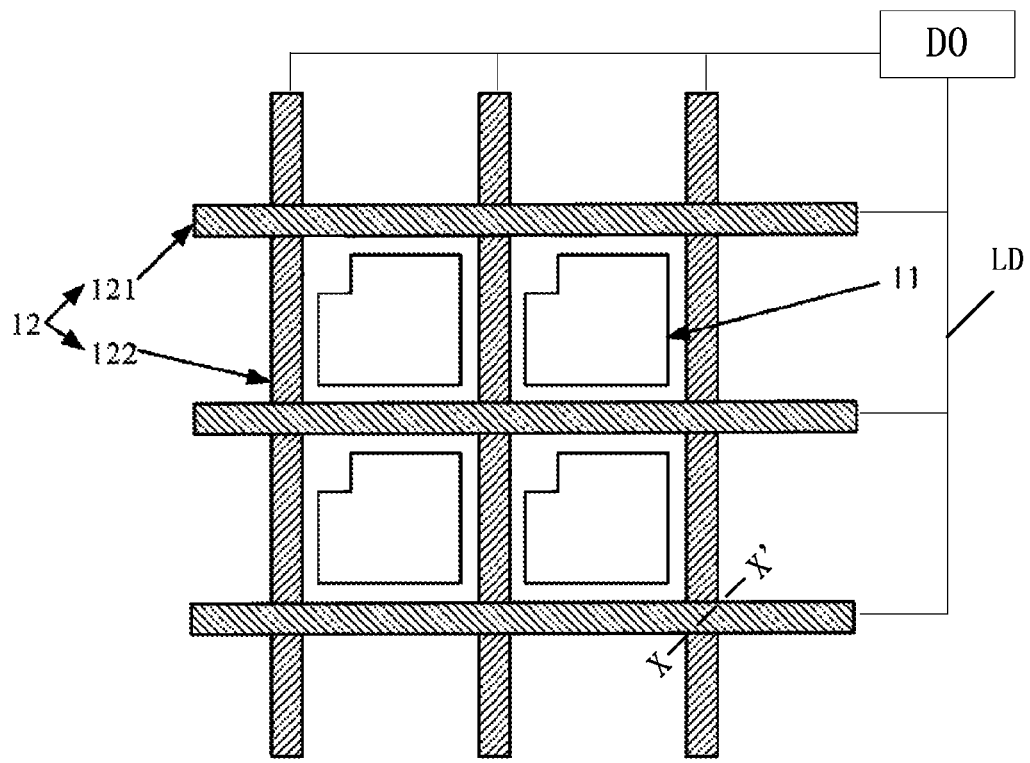
FIG. 1 is a top view illustrating an additional electrode of an array substrate of an electro chromism display device according to an embodiment of the invention.
Figure 3:
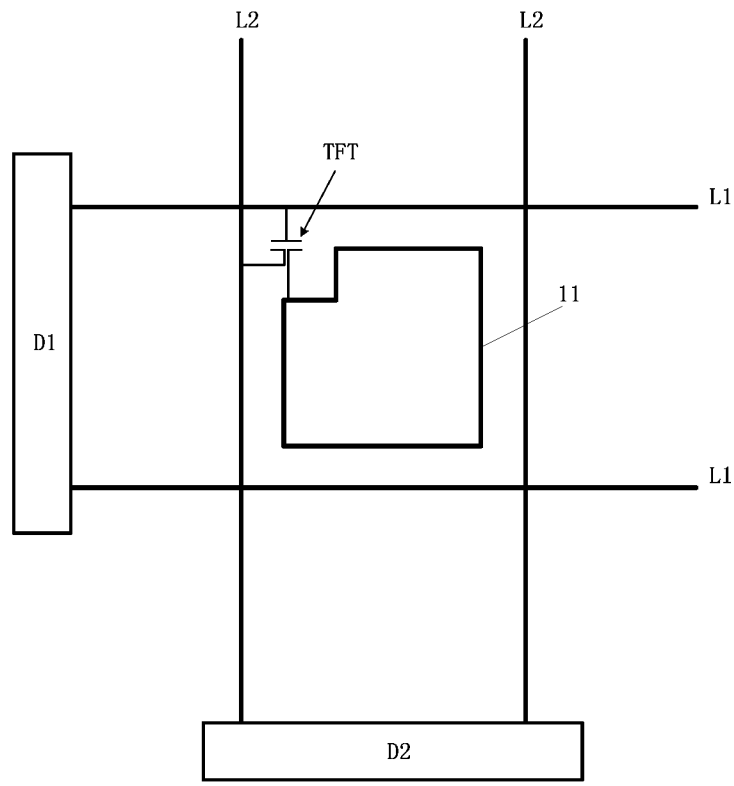
FIG. 3 is a plane view illustrating gate lines, data lines, and a pixel electrodes of an array substrate of an electro chromism display device according to an embodiment of the invention.
Figure 4:
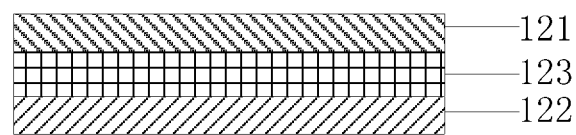
FIG. 4 is a cross sectional view along line XX' of FIG. 1 and illustrates a lateral additional electrode and a longitudinal additional electrode located in different layers.
Figure 5:
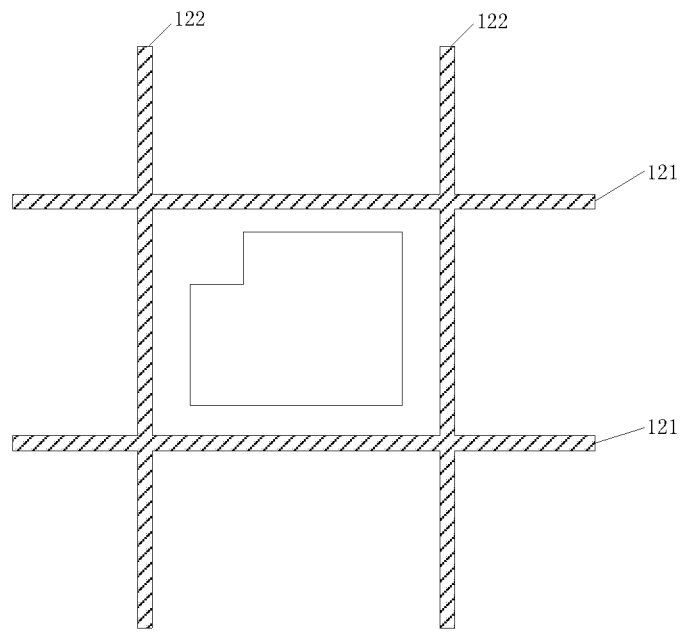
FIG. 5 is a plane view illustrating a lateral additional electrode and a longitudinal additional electrode located in a same layer.

An embodiment of the invention provides an array substrate for an electro chromism display device. As shown in FIG. 3, the array substrate includes gate lines L1, data lines L2, and pixel electrode 11 disposed within one of the pixel regions defined by the gate lines L1 and the data lines L2 intersecting with each other. The pixel electrode 11 is electronically connected with the gate line L1 and the data line L2 through a switching element, such as TFT. As shown in FIG. 1, the array substrate further includes an additional electrode 12 disposed between at least two adjacent pixel electrodes 11.

Figure 2:
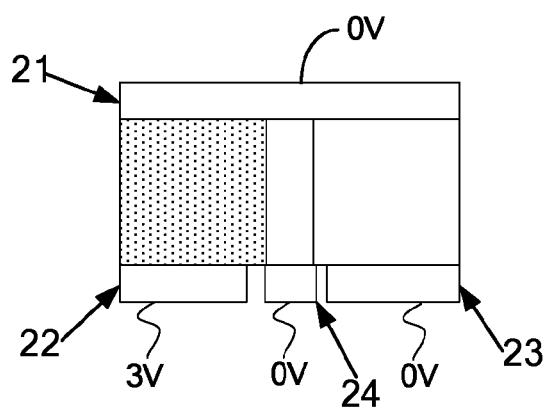
FIG. 2 is a schematic view illustrating a driving method of a display device according to an embodiment of the invention.

For example, the voltage applied to a common electrode on an opposed substrate of an electro chromism display device is 0V, the voltage applied to the pixel electrode on the array substrate of the electro chromism display device is within 0~+3V, the additional electrode is disposed between two adjacent pixel electrodes, and the voltage applied to the additional electrode is 0V. In this case, the voltage difference between the additional electrode and the common electrode is 0 and the color of the EC material between the additional electrode and the common electrode does not change, so that mutual diffusion of the EC materials on both sides of the additional electrode are prevented and the color crosstalk is avoided. As an example, as shown in FIG. 2, the voltage applied to the common electrode 21 on the opposed substrate is 0V, the voltage applied to the left pixel electrode 22 on the array substrate is +3V, the voltage applied to the right pixel electrode 23 is 0V, and the voltage applied to the additional electrode 24 between the two pixel electrodes 22 and 23 is 0V. At this time, as the voltage difference between the left pixel electrode 22 and the common electrode 21 is 3V, the color of the EC material above the left pixel electrode 22 changes, and as the voltage difference between the right pixel electrode 23 and the common electrode 21 is 0V, the color of the EC material above the right pixel electrode 23 does not change. Since the voltage difference between the additional electrode 24 and the common electrode 21 is 0, the color of the EC material above the additional electrode 24 does not change as well, thereby the mutual diffusion between the EC materials with different colors on both sides of the additional electrode can be effectively prevented and the color crosstalk in the image displayed on the electro chromism display device can be avoided.

Preferably, as shown in FIG. 1, the additional electrode 12 is disposed between any two adjacent pixel electrodes on the array substrate. The additional electrode 12 includes a lateral additional electrode 121 and a longitudinal additional electrode 122, the lateral additional electrode 121 extends along a horizontal direction in FIG. 1, and the longitudinal additional electrode 122 extends along a longitudinal direction in FIG. 1. Generally, the gate line extends along the horizontal direction and the data line extends along the longitudinal direction; therefore, it can also be said that the lateral additional electrode 121 extends along the gate line direction and the longitudinal additional electrode 122 extends along the data line direction.

For example, the lateral additional electrode 121 and the longitudinal additional electrode 122 of the additional electrode are disposed in different layers, and the lateral additional electrode and the longitudinal additional electrode are spaced apart with an insulating layer 123 disposed therebetween. At this time, preferably, the lateral additional electrode 121 and the pixel electrode 11 are disposed in the same layer, and the longitudinal additional electrode 122 is disposed in the layer different from that of the lateral additional electrode 121 and the pixel electrode 11. Or preferably, the longitudinal additional electrode 122 and the pixel electrode 11 are disposed in the same layer, and the lateral additional electrode 121 is disposed in the layer different from that of the longitudinal additional electrode 122 and the pixel electrode 11.

Here, it should be noted that both the lateral additional electrode and the longitudinal additional electrode are connected with an additional electrode driver chip D0 via a lead LD, referring to FIG. 1, so that the additional electrode driver chip D0 provides drive voltages for the lateral additional electrode 121 and the longitudinal additional electrode 122.

Being disposed in different layers is directed to at least two patterns, and the at least two patterns being disposed in different layers indicates that forming the at least two patterns by patterning at least two thin films respectively. Two patterns being disposed in different layers indicates that forming the two patterns by patterning two thin films respectively. For example, the lateral additional electrode 121 and the longitudinal additional electrode 122 being disposed in different layers indicates that: forming a lower electrode by patterning a first conductive film, forming an upper electrode by patterning a second conductive film, wherein the lower electrode is the lateral additional electrode 121 (or the longitudinal additional electrode 122), and the upper electrode is the longitudinal additional electrode 122 (or the lateral additional electrode 121).

Being disposed in the same layer is directed to at least two patterns, and the at least two patterns being disposed in the same layer indicates that forming the at least two patterns by patterning the same thin film. For example, the lateral additional electrode 121 and the pixel electrode 11 being disposed in the same layer indicates that: forming the pixel electrode 11 and the lateral additional electrode 121 by patterning the same transparent conductive film.

For example, the lateral additional electrode 121 and the longitudinal additional electrode 122 of the additional electrode may be disposed in the same layer. Preferably, the additional electrode 12 (the lateral additional electrode 121 and the longitudinal additional electrode 122) and the pixel electrode 11 are disposed in the same layer. The additional electrode 12 is connected with the additional electrode driver chip D0 via the lead LD, so that the additional electrode driver chip provides the drive voltage for the additional electrode 12.

An embodiment of the invention further provides a fabrication method for the above-mentioned array substrate. The fabrication method includes: forming a pixel electrode and an additional electrode on a substrate, wherein the additional electrode is disposed between at least two adjacent pixel electrodes.

Preferably, the additional electrode is formed between any two adjacent pixel electrodes on the array substrate, and the additional electrode includes a lateral additional electrode and a longitudinal additional electrode.

Figure 6:
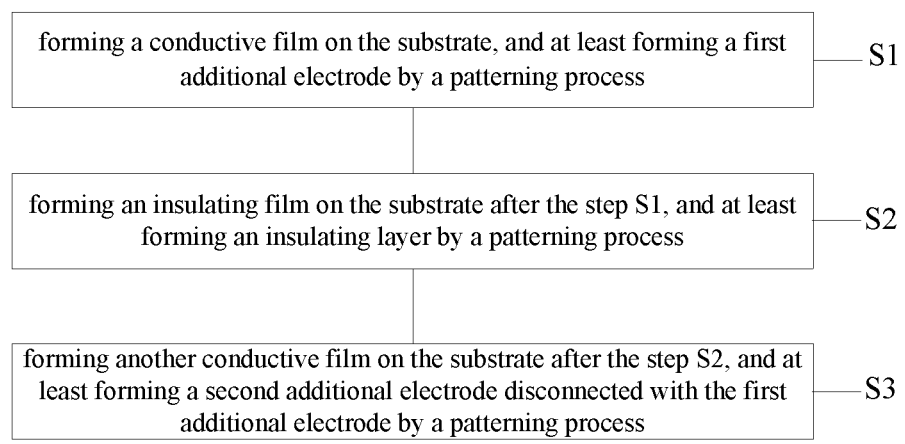
FIG. 6 is a diagram showing a fabrication method for an array substrate of an electro chromism display device.

For example, the lateral additional electrode and the longitudinal additional electrode of the additional electrode are disposed in different layers. At this time, as shown in FIG. 6, the forming the additional electrode on the substrate includes steps of:

S1: forming a conductive film on the substrate, and at least forming a first additional electrode by a patterning process;

S2: forming an insulating film on the substrate after the step S1 to form an insulating layer;

S3: forming another conductive film on the substrate after the step S2, and at least forming a second additional electrode disconnected with the first additional electrode by a patterning process.

The conductive film may be a transparent conductive film, such as, an Indium Tin Oxides (ITO) film. The conductive film may also be a non-transparent conductive film, such as, a metal film.

The first additional electrode may be the lateral additional electrode, and the second additional electrode may be the longitudinal additional electrode. Or, the first additional electrode may be the longitudinal additional electrode, and the second additional electrode may be the lateral additional electrode.

Preferably, the first additional electrode and the pixel electrode are disposed in the same layer. At this time, the step S1 includes: forming a transparent conductive film on the substrate, and at least forming the first additional electrode and the pixel electrode by a patterning process.

Since the first additional electrode and the pixel electrode are disposed in the same layer, the conductive film in the step S1 must be the transparent conductive film. Since the second additional electrode is disposed in the layer different from that of the first additional electrode and the pixel electrode, the conductive film in the step S3 may be either the transparent conductive film or the metal film, which will not be limited herein.

Preferably, the second additional electrode and the pixel electrode are disposed on the same layer. At this time, the step S3 includes: forming a transparent conductive film on the substrate after the step S2, and at least forming the second additional electrode and pixel electrode disconnected with the first additional electrode by a patterning process. Since the second additional electrode and the pixel electrode are disposed in the same layer, the conductive film in the step S3 must be the transparent conductive film. Since the first additional electrode is disposed in the layer different from that of the second additional electrode and the pixel electrode, the conductive film in the step S1 may be either the transparent conductive film or the metal film, which will not be limited herein.

For example, the lateral additional electrode and the longitudinal additional electrode of the additional electrode are disposed in the same layer. At this time, the forming the pixel electrode and the additional electrode on the substrate may include: forming a transparent conductive film on the substrate, and forming the pixel electrode and the additional electrode by a patterning process. That is, the pixel electrode and the additional electrode are disposed in the same layer.

An embodiment of the invention further provides an electro chromism display device. The display device includes an array substrate as described above and an additional electrode driver chip, the additional electrode driver chip is electrically connected with an additional electrode on the array substrate via a lead. The display device may be any products or components with display function, such as a display device for meter display, a display device for outdoor advertisement, and the like.

An embodiment of the invention further provides a driving method for an electro chromism display device as described above. The driving method includes: applying a scanning signal to a gate line L1 in a line-by-line mode by a gate driver chip D1, and in the meantime, applying a voltage signal to a data line L2 by a data driver chip D2. Moreover, in the embodiment of the invention, the driving method further includes: applying a drive voltage to a longitudinal additional electrode 122 by an additional electrode driver chip D0; and during applying the scanning signal to the gate line by the gate driver chip, applying the drive voltage by the additional electrode driver chip D0 to the lateral additional electrodes 121 on both sides of each pixel electrode in a pixel electrode row corresponding to the gate line; wherein the drive voltage is equal to a voltage applied on a common electrode.

At this time, the driving method is applicable to the electro chromism display device where the longitudinal additional electrode and the lateral additional electrode are disposed in different layers. When the display device displays images, the longitudinal additional electrode is applied with the drive voltage all the time, and only during the pixel electrode is driven, the lateral additional electrodes on both sides of the pixel electrode are applied with the drive voltage.

An embodiment of the invention further provides a driving method for an electro chromism display device as described above. The driving method includes: applying a drive voltage to an additional electrode by an additional electrode driver chip, wherein the drive voltage is equal to a voltage applied on a common electrode.

At this time, the driving method is applicable to the electro chromism display device where a longitudinal additional electrode and a lateral additional electrode are disposed in the same layer. The longitudinal additional electrode and the lateral additional electrode are connected with each other. When the display device displays images, the additional electrode driver chip applies the drive voltage to the longitudinal additional electrode and the lateral additional electrode simultaneously.

In the above descriptions, the common electrode is disposed on the opposed substrate opposite to the array substrate. However, the common electrode may be disposed on the array substrate.

The foregoing embodiments merely are exemplary embodiments of the invention, and not intended to define the scope of the invention, and the scope of the invention is determined by the appended claims.

What is claimed is:

1. An array substrate of an electro chromism display device, including a gate line, a data line, and a pixel electrode disposed within a pixel region defined by the gate line and the data line intersecting with each other, the pixel electrode being electronically connected with the gate line and the data line through a switching element, wherein the array substrate further includes: an additional electrode disposed between at least two adjacent pixel electrodes, wherein, the additional electrode is disposed between any two adjacent pixel electrodes on the array substrate, and the additional electrode includes a lateral additional electrode extending along a direction of the gate line and a longitudinal additional electrode extending alone a direction of the data line, the lateral additional electrode and the longitudinal additional electrode are disposed in different layers, the lateral additional electrode and the longitudinal additional electrode are spaced apart with an insulating layer disposed there between, wherein, both the lateral additional electrode and the longitudinal additional electrode are connected with an additional electrode driver chip via a lead, the additional electrode driver chip is configured such that only when the pixel electrode is driven, the lateral additional electrode on both sides of the pixel electrode are applied with a drive voltage.

2. The array substrate according to claim 1, wherein
   one of the lateral additional electrode and the longitudinal additional electrode is disposed in a same layer with the pixel electrode, and a material for forming the one of the lateral additional electrode and the longitudinal additional electrode is identical with a material for forming the pixel electrode.

3. The array substrate according to claim 1, wherein the lateral additional electrode and the longitudinal additional electrode are disposed in a same layer.

4. A driving method for an electro chromism display device, wherein the display device includes the array substrate according to claim 1 and an additional electrode driver chip, and the additional electrode driver chip is electrically connected with the additional electrode via a lead, the driving method includes: applying a scanning signal to the gate line in a line-by-line mode by a gate driver chip, and in the meantime, applying a voltage signal to the data line by a data driver chip wherein, the additional electrode includes a lateral additional electrode extending along a direction of the gate line and a longitudinal additional electrode extending along a direction of the data line, and the lateral additional electrode and the longitudinal additional electrode are disposed in different layers; the driving method further includes: only when applying the scanning signal to the gate line by the gate driver chip to drive the pixel electrode, applying the drive voltage by the additional electrode driver chip to the lateral additional electrode on both sides of the pixel electrode; and the drive voltage applied to the longitudinal additional electrode and the drive voltage applied to the lateral additional electrode are equal to the voltage applied on the common electrode.

5. A fabrication method for an array substrate of an electro chromism display device, the array substrate including a gate line, a data line, and a pixel electrode disposed within a pixel region defined by the gate line and the data line intersecting with each other, wherein the method includes: forming the pixel electrode and an additional electrode on a substrate, and the additional electrode is disposed between at least two adjacent pixel electrodes, wherein, the additional electrode is disposed between any two adjacent pixel electrodes on the array substrate, and the additional electrode includes a lateral additional electrode extending alone a direction of the gate line and a longitudinal additional electrode extending along a direction of the data line, the lateral additional electrode and the longitudinal additional electrode are disposed in different layers, the lateral additional electrode and the longitudinal additional electrode are spaced apart with an insulating layer disposed there between, wherein, both the lateral additional electrode and the longitudinal additional electrode are connected with an additional electrode driver chip via a lead, the additional electrode driver chip is configured such that only when the pixel electrode is driven, the lateral additional electrode on both sides of the pixel electrode are applied with a drive voltage.

6. The fabrication method according to claim 5, wherein the method includes:
   step S1: forming a conductive film on the substrate, and at least forming one of the lateral additional electrode and the longitudinal additional electrode by a patterning process;
   step S2: forming an insulating film on the substrate after the step S1, and at least forming an insulating layer by a patterning process;
   step S3: forming another conductive film on the substrate after the step S2, and at least forming the other one of the lateral additional electrode and the longitudinal additional electrode by a patterning process.

7. The fabrication method according to claim 6, wherein the step S1 includes:
   forming a transparent conductive film on the substrate, and at least forming the one of the lateral additional electrode and the longitudinal additional electrode and the pixel electrode by a patterning process.

8. The fabrication method according to claim 6, wherein the step S3 includes:
   forming a transparent conductive film on the substrate after the step S2, and at least forming the other one of the lateral additional electrode and the longitudinal additional electrode by a patterning process.

9. The fabrication method according to claim 6, wherein the one of the lateral additional electrode and the longitudinal additional electrode is the lateral additional electrode extending along the direction of the gate line; or
   the one of the lateral additional electrode and the longitudinal additional electrode is the longitudinal additional electrode extending along the direction of the data line.

10. The fabrication method according to claim 7, wherein the one of the lateral additional electrode and the longitudinal additional electrode is the lateral additional electrode extending along the direction of the gate line; or
    the one of the lateral additional electrode and the longitudinal additional electrode the longitudinal additional electrode extending along the direction of the data line.

11. The fabrication method according to claim 8, wherein the one of the lateral additional electrode and the longitudinal additional electrode is the lateral additional electrode extending along the direction of the gate line; or
    the one of the lateral additional electrode and the longitudinal additional electrode is the longitudinal additional electrode extending along the direction of the data line.

* * * * *